(12) United States Patent
Chen et al.

(10) Patent No.: US 12,108,543 B2
(45) Date of Patent: Oct. 1, 2024

(54) TESTING SUBSTRATE AND MANUFACTURING METHOD THEREOF AND PROBE CARD

(71) Applicant: HERMES TESTING SOLUTIONS INC., Hsinchu (TW)

(72) Inventors: Chiao-Pei Chen, Hsinchu (TW); Chun-Hsiung Chou, Hsinchu (TW)

(73) Assignee: HERMES TESTING SOLUTIONS INC., Hsinchu (TW)

( * ) Notice: Subject to any disclaimer, the term of this patent is extended or adjusted under 35 U.S.C. 154(b) by 303 days.

(21) Appl. No.: 17/689,986

(22) Filed: Mar. 9, 2022

(65) Prior Publication Data

US 2023/0217600 A1    Jul. 6, 2023

(30) Foreign Application Priority Data

Dec. 30, 2021   (TW) .................. 110149656

(51) Int. Cl.
  *H05K 3/46* (2006.01)
  *G01R 1/073* (2006.01)
  *H05K 1/02* (2006.01)

(52) U.S. Cl.
  CPC ......... *H05K 3/462* (2013.01); *G01R 1/07307* (2013.01); *H05K 1/0284* (2013.01); *H05K 2203/016* (2013.01)

(58) Field of Classification Search
  CPC ............... H05K 3/462; H05K 1/0284; H05K 2203/016; H05K 2203/061; H05K 3/4688; H05K 1/144; H05K 1/0298; H05K 3/4611; H05K 3/4614; G01R 1/07307; G01R 1/07357; G01R 1/07378; G01R 1/07314
  See application file for complete search history.

(56) References Cited

U.S. PATENT DOCUMENTS

| | | | |
|---|---|---|---|
| 10,652,987 B2 | 5/2020 | Wang et al. | |
| 2008/0128915 A1* | 6/2008 | Ueda | H01L 23/147 257/E23.141 |
| 2011/0057678 A1* | 3/2011 | Kato | H05K 1/0306 324/756.03 |
| 2011/0148447 A1* | 6/2011 | Yoo | C04B 37/026 174/266 |
| 2013/0009306 A1* | 1/2013 | Tseng | H05K 3/4682 257/737 |
| 2013/0172962 A1* | 7/2013 | Song | A61N 5/0622 607/90 |
| 2015/0061719 A1* | 3/2015 | Lee | G01R 1/07378 324/756.03 |

(Continued)

FOREIGN PATENT DOCUMENTS

| | | |
|---|---|---|
| CN | 102621360 | 12/2014 |
| TW | I456203 | 10/2014 |
| TW | I728531 | 5/2021 |

*Primary Examiner* — Jermele M Hollington
*Assistant Examiner* — Zannatul Ferdous
(74) *Attorney, Agent, or Firm* — JCIPRNET

(57) ABSTRACT

A testing substrate includes a first build-up structure and a ceramic substrate. The ceramic substrate is arranged on the first build-up structure. The first bonding interface between the first build-up structure and the ceramic substrate includes a dielectric-to-dielectric bonding interface and a metal-to-metal bonding interface. A manufacturing method of a testing substrate and a probe card are also provided.

6 Claims, 9 Drawing Sheets

(56) References Cited

U.S. PATENT DOCUMENTS

2017/0354044 A1* 12/2017 Kurahashi ............ H05K 3/4038
2020/0105650 A1*  4/2020 Rangaswamy ......... H01L 24/73
2021/0398957 A1* 12/2021 Lan ....................... H01L 25/162

* cited by examiner

TESTING SUBSTRATE AND MANUFACTURING METHOD THEREOF AND PROBE CARD

CROSS-REFERENCE TO RELATED APPLICATION

This application claims the priority benefit of Taiwan application serial no. 110149656, filed on Dec. 30, 2021. The entirety of each of the above-mentioned patent applications is hereby incorporated by reference herein and made a part of this specification.

BACKGROUND

Technical Field

The disclosure relates to a substrate and a manufacturing method thereof and testing device, and in particular to a testing substrate and a manufacturing method thereof and a probe card.

Description of Related Art

Generally speaking, the testing substrate uses solder balls/solder paste to bond the build-up structure to the ceramic substrate through a reflow process, and then adds underfill between the bonding interfaces. However, the build-up structure and the ceramic substrate bonded in this way are prone to bridging failure, which in turn reduces the bonding yield of the testing substrate. In addition, the foregoing situation is more serious when the number of high I/O and the number of layers of the build-up structure are increased. Therefore, how to effectively improve the bonding yield of the testing substrate is a challenge.

SUMMARY

The present application provides a testing substrate, a method for manufacturing the same, and a probe card, which can effectively improve the bonding yield and interface strength of the testing substrate, and can also improve the reliability of the probe card using the testing substrate.

A testing substrate of the present application includes a first build-up structure and a ceramic substrate. The ceramic substrate is arranged on the first build-up structure. A first bonding interface between the first build-up structure and the ceramic substrate comprises a dielectric-to-dielectric bonding interface and a metal-to-metal bonding interface.

In one embodiment of the present application, the first build-up structure includes a first dielectric layer and a first patterned conductive layer embedded in the first dielectric layer, the ceramic substrate includes a second dielectric layer and a second patterned conductive layer embedded in the second dielectric layer, the first dielectric layer is in direct contact with the second dielectric layer, and the first patterned conductive layer is in direct contact with the second patterned conductive layer.

In one embodiment of the present application, a pitch of the second patterned conductive layer is greater than a pitch of the first patterned conductive layer.

In one embodiment of the present application, a size of the first build-up structure is the same as a size of the ceramic substrate.

In one embodiment of the present application, the testing substrate further includes a second build-up structure. The second build-up structure is arranged on a surface of the first build-up structure relative to the ceramic substrate, wherein a second bonding interface between the first build-up structure and the second build-up structure comprises a dielectric-to-dielectric bonding interface and a metal-to-metal bonding interface.

A method for manufacturing a testing substrate of the present application at least includes the following steps. A first build-up structure and a ceramic substrate are provided. The first build-up structure is bonded to the ceramic substrate by a hybrid bonding process, so that a first bonding interface including a dielectric-to-dielectric bonding interface and a metal-to-metal bonding interface is formed between the first build-up structure and the ceramic substrate.

In one embodiment of the present application, the provided first build-up structure is arranged on a glass carrier.

In one embodiment of the present application, a process temperature of the hybrid bonding process is between 25° C. and 350° C., and a process time is between 1 minute and 60 minutes.

In one embodiment of the present application, the above-mentioned manufacturing method further includes bonding a second build-up structure on the first build-up structure by the hybrid bonding process.

A probe card of the present application includes a testing substrate, a plurality of probes and a printed circuit board (PCB). The testing substrate includes a first build-up structure and a ceramic substrate. The ceramic substrate is arranged on the first build-up structure. A first bonding interface between the first build-up structure and the ceramic substrate comprises a dielectric-to-dielectric bonding interface and a metal-to-metal bonding interface. The testing substrate is disposed between the plurality of probes and the PCB, and the plurality of probes are adjacent to the first build-up structure, the PCB is adjacent to the ceramic substrate.

Based on the above, the first build-up structure is bonded to the ceramic substrate by a hybrid bonding process in the testing substrate of the present application, so that a first bonding interface including a dielectric-to-dielectric bonding interface and a metal-to-metal bonding interface is formed between the first build-up structure and the ceramic substrate. In this way, the problem of easy bridging failure by solder ball/solder paste bonding can be improved, the bonding yield and interface strength of the testing substrate can be effectively improved, and the reliability of the probe card using the testing substrate can also be improved.

In order to make the above-mentioned features and advantages of the present application more obvious and easier to understand, the following specific examples are given, and are described in detail as follows in conjunction with the accompanying drawings.

DESCRIPTION OF THE EMBODIMENTS

Figure 1A:
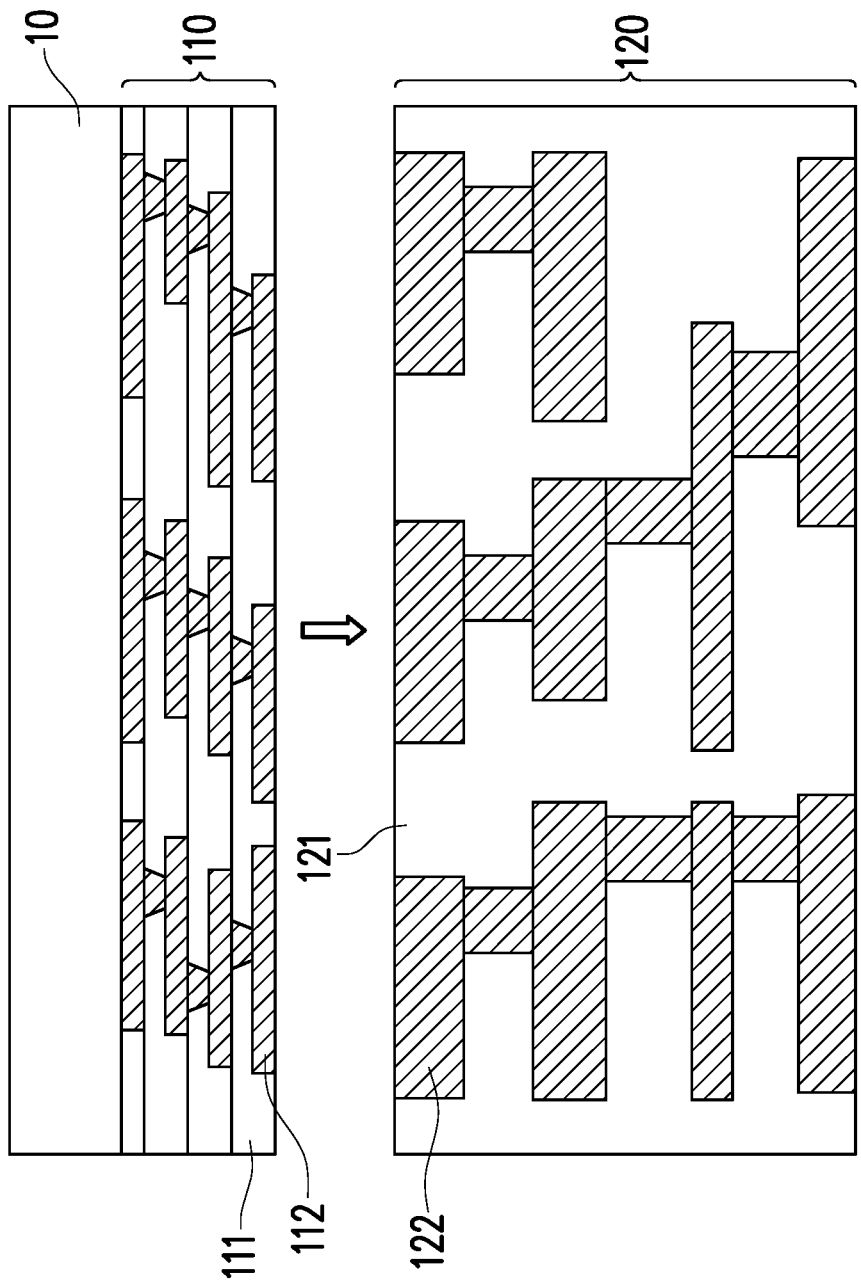
FIG. 1A to 1C are partial cross-sectional schematic diagrams of partial manufacturing methods of a testing substrate according to some embodiments of the present application.

Directional terms (e.g., up, down, right, left, front, back, top, bottom) as used herein are used only for reference to the drawings and are not intended to imply absolute orientation.

Unless explicitly stated otherwise, any method described herein is in no way intended to be construed as requiring that its steps be performed in a particular order.

The present application is described more fully with reference to the drawings of the present embodiment. However, the present application may be embodied in various forms and should not be limited to the embodiments described herein. The thickness, dimensions or size of layers or regions in the drawings may be exaggerated for clarity. The same or similar reference numerals denote the same or similar elements, and the repeated descriptions will not be repeated in the following paragraphs.

Figure 1B:
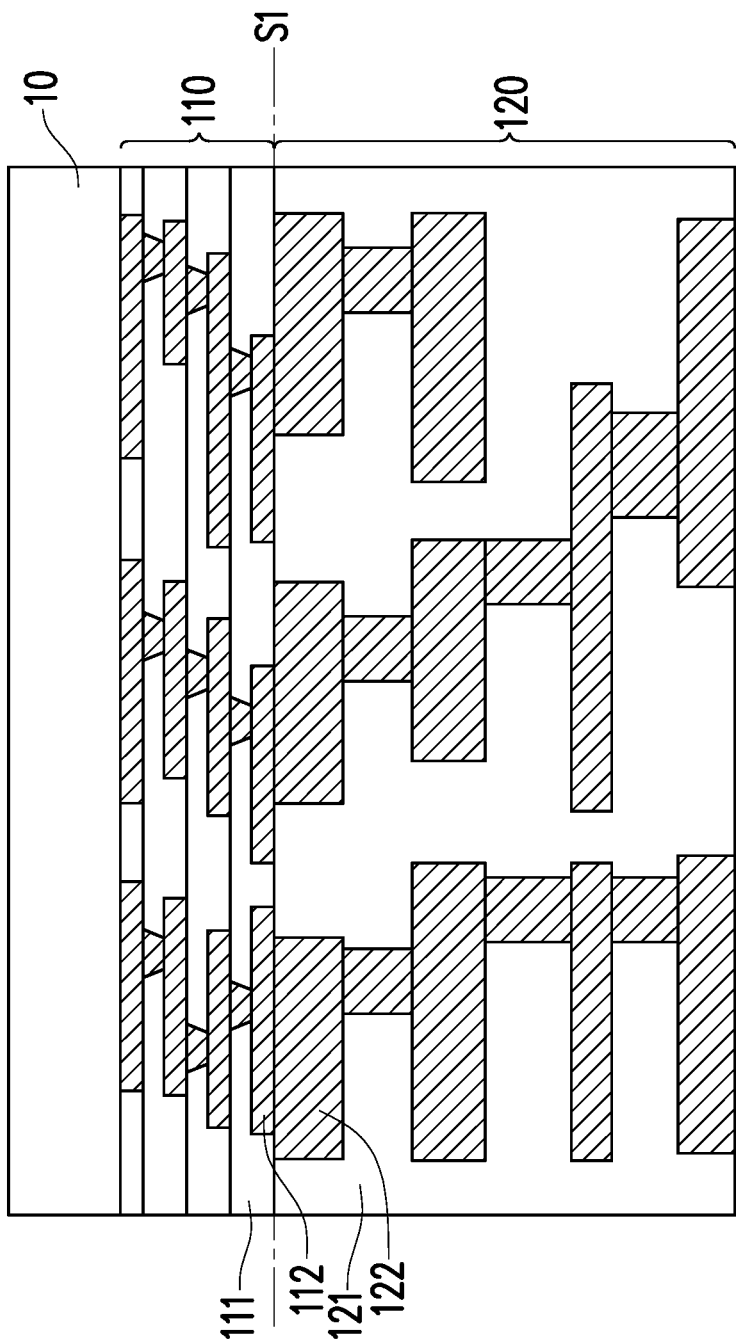
Figure 1C:
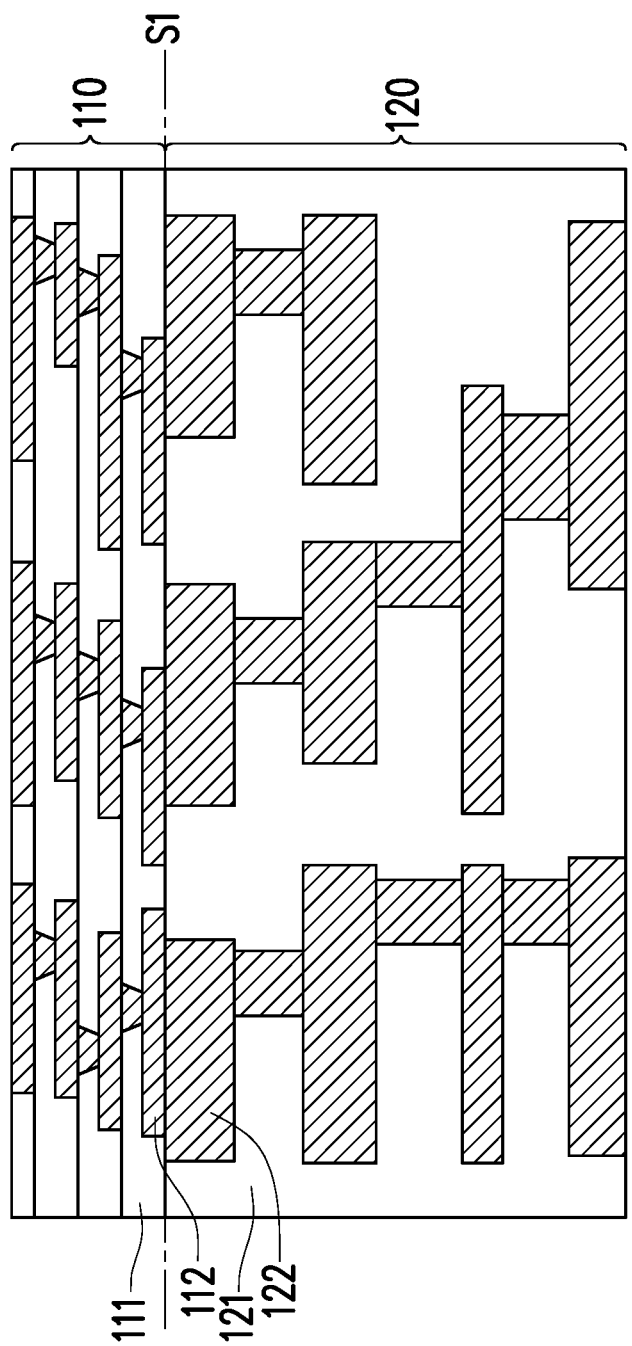

FIG. 1A to 1C are partial cross-sectional schematic diagrams of partial manufacturing methods of a testing substrate according to some embodiments of the present application.

Referring to FIG. 1A, in the embodiment, the manufacturing process of the testing substrate 100 may include the following steps. First, a first build-up structure 100 and a ceramic substrate 120 are provided. Here, the provided first build-up structure 110 may be disposed on the glass carrier 10, but the present application is not limited thereto. Other suitable carriers may also be used, as long as the material can support the first build-up structure 110 formed thereon and withstand subsequent processes.

In some embodiments, the first build-up structure 110 includes a first dielectric layer 111 and a first patterned conductive layer 112 embedded in the first dielectric layer 111, and the ceramic substrate includes a second dielectric layer 121 and a second patterned conductive layer 122 embedded in the second dielectric layer 121. Here, the first patterned conductive layer 112 and the second patterned conductive layer 122 can be used for subsequent electrical connections.

Referring to FIG. 1B and FIG. 1C, the first build-up structure 110 is bonded to the ceramic substrate 120 by a hybrid bonding process in the testing substrate 110 of the present embodiment, so that a first bonding interface S1 including a dielectric-to-dielectric bonding interface and a metal-to-metal bonding interface is formed between the first build-up structure 110 and the ceramic substrate 120. In this way, the problem of easy bridging failure by solder ball/solder paste bonding can be improved, the bonding yield and interface strength of the testing substrate can be effectively improved, and the reliability of the probe card using the testing substrate can also be improved. In addition, when the first build-up structure 110 has the carrier 10, the carrier 10 can be removed by an appropriate method after the bonding is completed, which is removed, for example, by laser depaneling or other suitable means. The testing substrate 100 is substantially completed through the above-described production.

In some embodiments, since the hybrid bonding process is used for bonding, the first dielectric layer 111 is in direct contact with the second dielectric layer 121, and the first patterned conductive layer 112 is in direct contact with the second patterned conductive layer 122. In other words, the first build-up structure 110 and the ceramic substrate 120 may have a substantially seamless bonding interface (the first bonding interface S1). In addition, the first build-up structure 110 may be a thin film structure, so the testing substrate 100 may be a thin film multilayer ceramic substrate, but the present application is not limited thereto.

In some embodiments, as the semiconductor manufacturing process continues to shrink, the pad density increases, the spacing shrinks, and the probes also shrink the spacing accordingly. In this case, the pitch of the second patterned conductive layer 122 may be greater than the pitch of the first patterned conductive layer 112, so the pitch difference between the two ends of the testing substrate 100 (large pitch at the printed circuit board end and small pitch at the probe end) can be satisfied. In other words, the size of the first patterned conductive layer 112 can meet the test requirements of the subsequent testing substrates 100 with small pitches. For example, the bonding pitch of the two ends of the testing substrate 100, such as the printed circuit board end, may be between 300 μm and 800 μm, and the bonding pitch of the probe end may be between 50 μm and 130 μm, the aforementioned bonding pitch can be adjusted according to the actual design requirements, but the present application is not limited thereto. Here, the definition of the pitch can be the distance between the center points of two adjacent metal pads on the aforementioned testing substrate 100. For example, the distance between the ends of the printed circuit board is the minimum center-to-center distance between the center points of two adjacent metal pads on the circuit layer of the testing substrate 100 closest to the printed circuit board, and the distance between the probe ends is the minimum center-to-center distance between the center points of two adjacent metal pads on the circuit layer of the testing substrate 100 closest to the probe, but the application is not limited thereto.

In some embodiments, the material of the first dielectric layer 111 may include polyimide (PI), benzocyclobutene (BCB), polybenzoxazole (PBO) or other suitable electrical insulating materials, and the material of the first patterned conductive layer 112 may include copper, gold, nickel, aluminum, platinum, tin, silver, combinations thereof, alloys thereof, or other suitable conductive materials. In addition, the material of the second dielectric layer 121 is aluminum oxide (Al2O3), aluminum nitride (AlN), High Temperature Co-fired Ceramic (HTCC), Low Temperature Co-fired Ceramic (LTCC), and the material of the second patterned conductive layer 122 may include copper, gold, nickel, aluminum, platinum, tin, silver, combinations thereof, alloys thereof, or other suitable conductive materials.

In some embodiments, the material of the first patterned conductive layer 112 is the same as the material of the second patterned conductive layer 122, for example, copper-to-copper (Cu—Cu) or gold-to-gold (Au—Au) bonding, but the application is not limited thereto.

In some embodiments, the process temperature of the hybrid bonding process is between 200° C. and 250° C., and the process time is between 15 minutes and 30 minutes. Since the ceramic substrate 120 exhibits excellent rigidity, flatness, thermal expansion coefficient, etc., it can better withstand the challenges brought by the hybrid bonding process in terms of temperature and time, but the present application is not limited thereto.

In some embodiments, the first build-up structure 110 is a flexible circuit board, so it is less able to withstand the process of multiple reflows, and the multiple reflows are also prone to deformation or warpage of the first build-up structure 110. Therefore, the bonding method without reflow in this embodiment can effectively improve the bonding yield, but the present application is not limited thereto.

In some embodiments, a size of the first build-up structure 110 is the same as a size of the ceramic substrate 120. Therefore, better coplanarity can be achieved, so that the pressure distribution during bonding can be more even, so the bonding yield of the testing substrate 100 can be further improved, but the present application is not limited thereto.

It must be noted here that the following embodiments follow the element numbers and partial contents of the above-mentioned embodiments, wherein the same or similar numbers are used to represent the same or similar elements, and the description of the same technical content is omitted. For the description of the omitted part, reference may be made to the foregoing embodiments, and repeated descriptions are not repeated in the following embodiments.

Figure 2A:
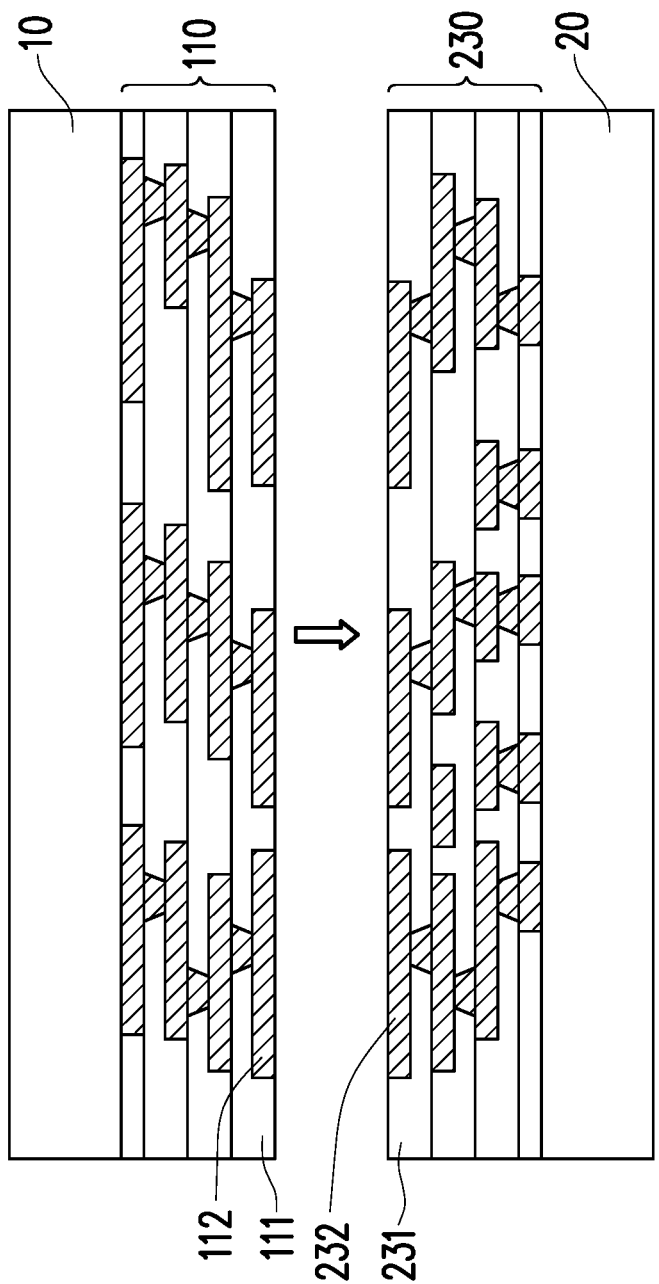
FIG. 2A to 2D are partial cross-sectional schematic diagrams of partial manufacturing methods of a testing substrate according to some embodiments of the present application.
Figure 2B:
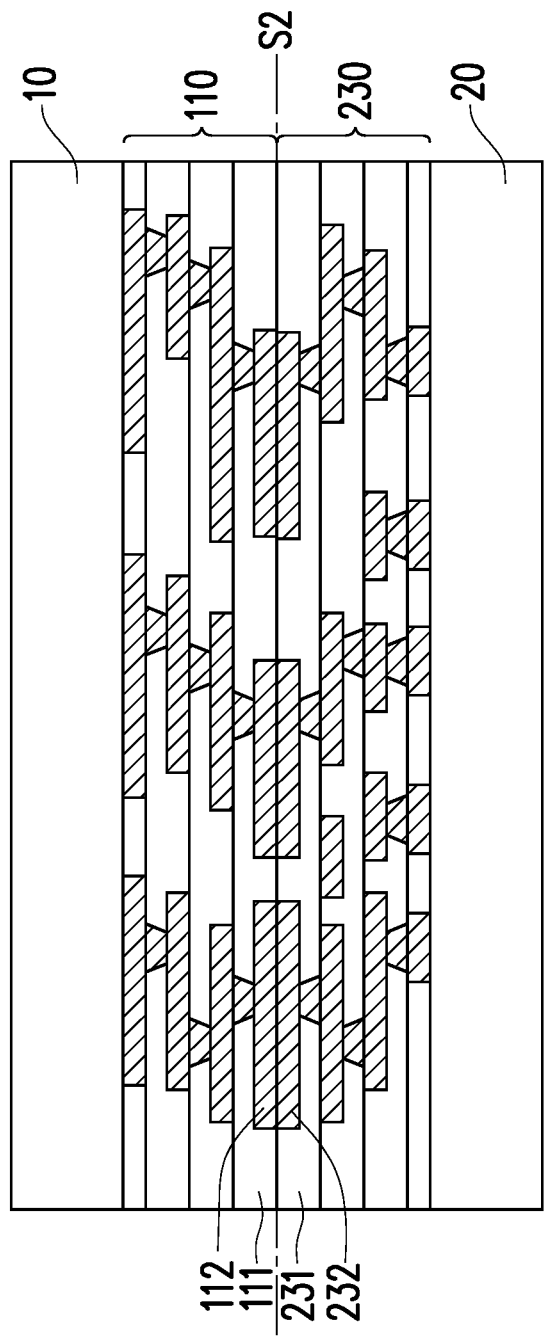

FIG. 2A to 2D are partial cross-sectional schematic diagrams of partial manufacturing methods of a testing substrate according to some embodiments of the present application. Referring to FIG. 2A to 2D, the second build-up structure 230 is formed on the first build-up structure 110 before bonding the ceramic substrate 120 in the testing substrate 200 of the present embodiment, so it can be further applied to a high-I/O-count and complex wafer. The manufacturing process of the testing substrate 200 includes at least the following steps. First, as shown in FIGS. 2A and 2B, the second build-up structure 230 is bonded on the first build-up structure 110, wherein the second build-up structure 230 can be formed on the glass carrier 20, but the application is not limited thereto.

Further, for example, the second build-up structure 230 can be bonded to the first build-up structure 110 by the hybrid bonding process. Therefore, the second bonding interface S2 between the first build-up structure 120 and the second build-up structure 130 includes a dielectric-to-dielectric bonding interface and a metal-to-metal bonding interface, but the application is not limited thereto.

Figure 2C:
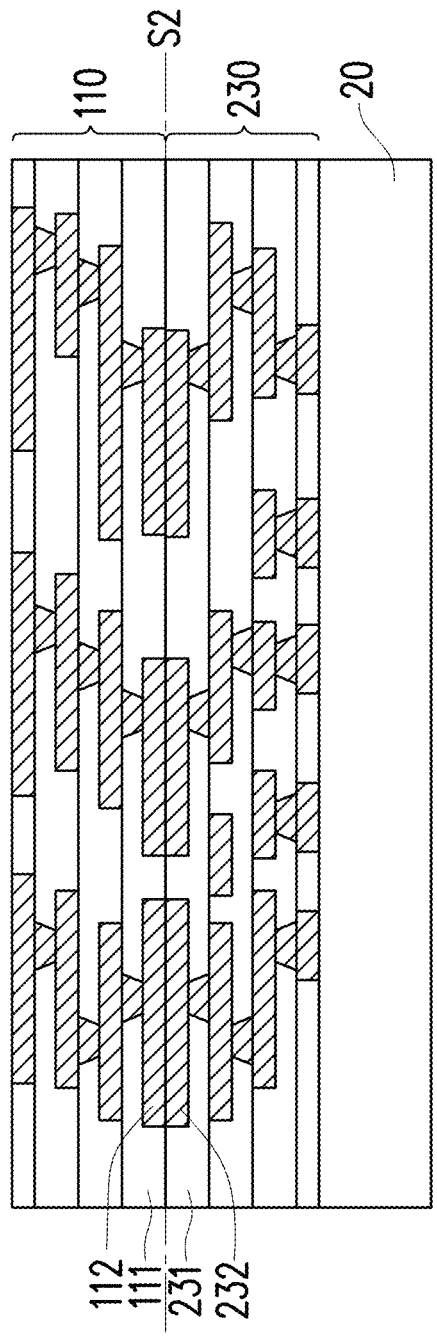

Next, as shown in FIGS. 2B to 2C, after the second build-up structure 230 is bonded to the first build-up structure 110, a laser depaneling process can be performed to remove the carrier 10, but the application is not limited thereto.

Figure 2D:
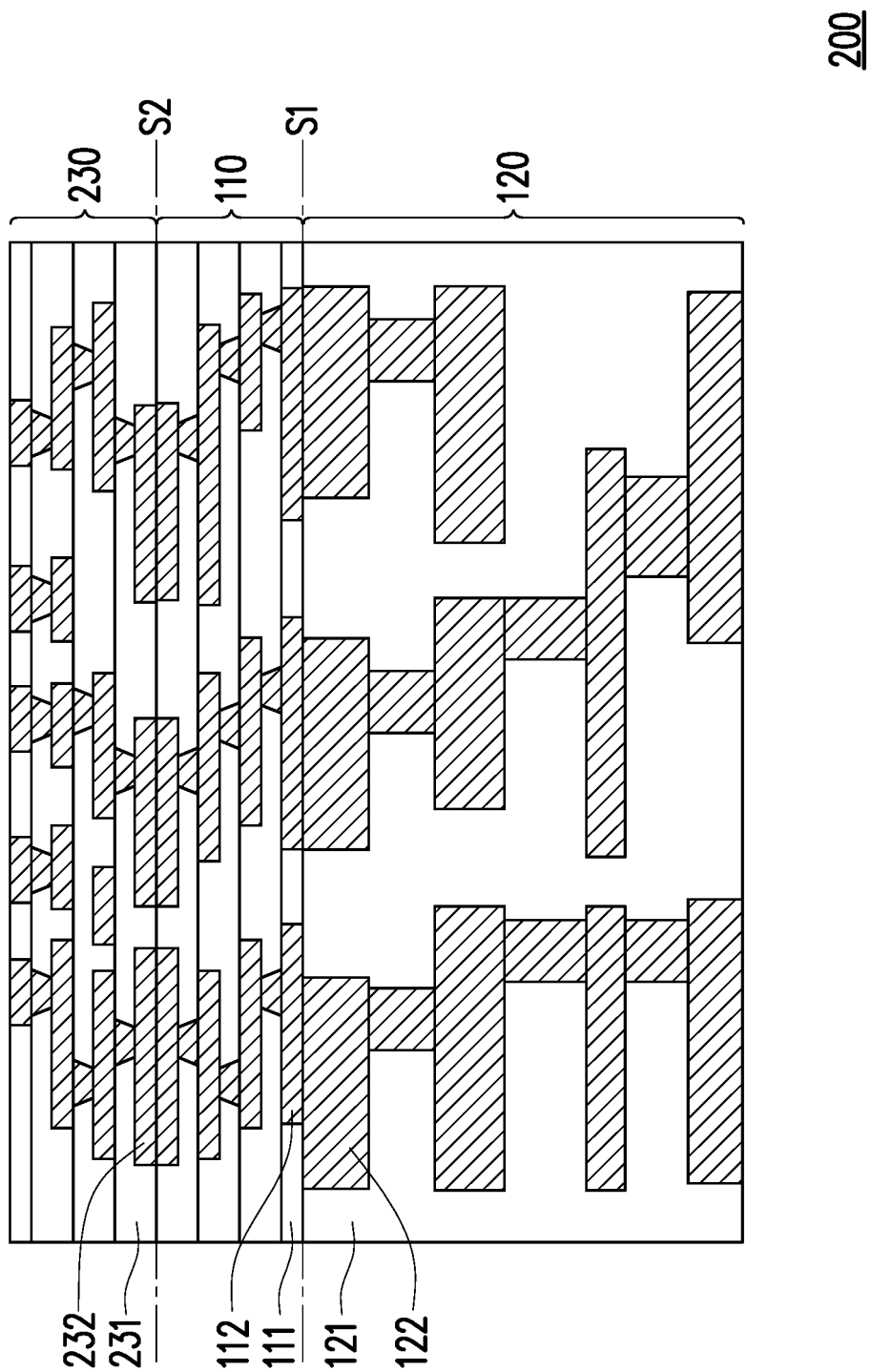

Then, similar to FIGS. 1A to 1C, as shown in FIGS. 2C and 2D, the first build-up structure 110 can be bonded to the ceramic substrate 120 by the hybrid bonding process, and after the bonding is completed, a suitable method can be used to remove the carrier 20. After the above process, the manufacturing of the testing substrate 200 of this embodiment can be substantially completed.

In some embodiments, the second build-up structure 230 includes a third dielectric layer 231 and a third patterned conductive layer 232 embedded in the third dielectric layer 231, wherein the material of the third dielectric layer 231 may include PI, BCB, PBO or other suitable electrical insulating materials, and the material of the third patterned conductive layer 232 may include copper, gold, nickel, aluminum, platinum, tin, silver, combinations thereof, alloys thereof, or other suitable conductive materials.

Figure 3:
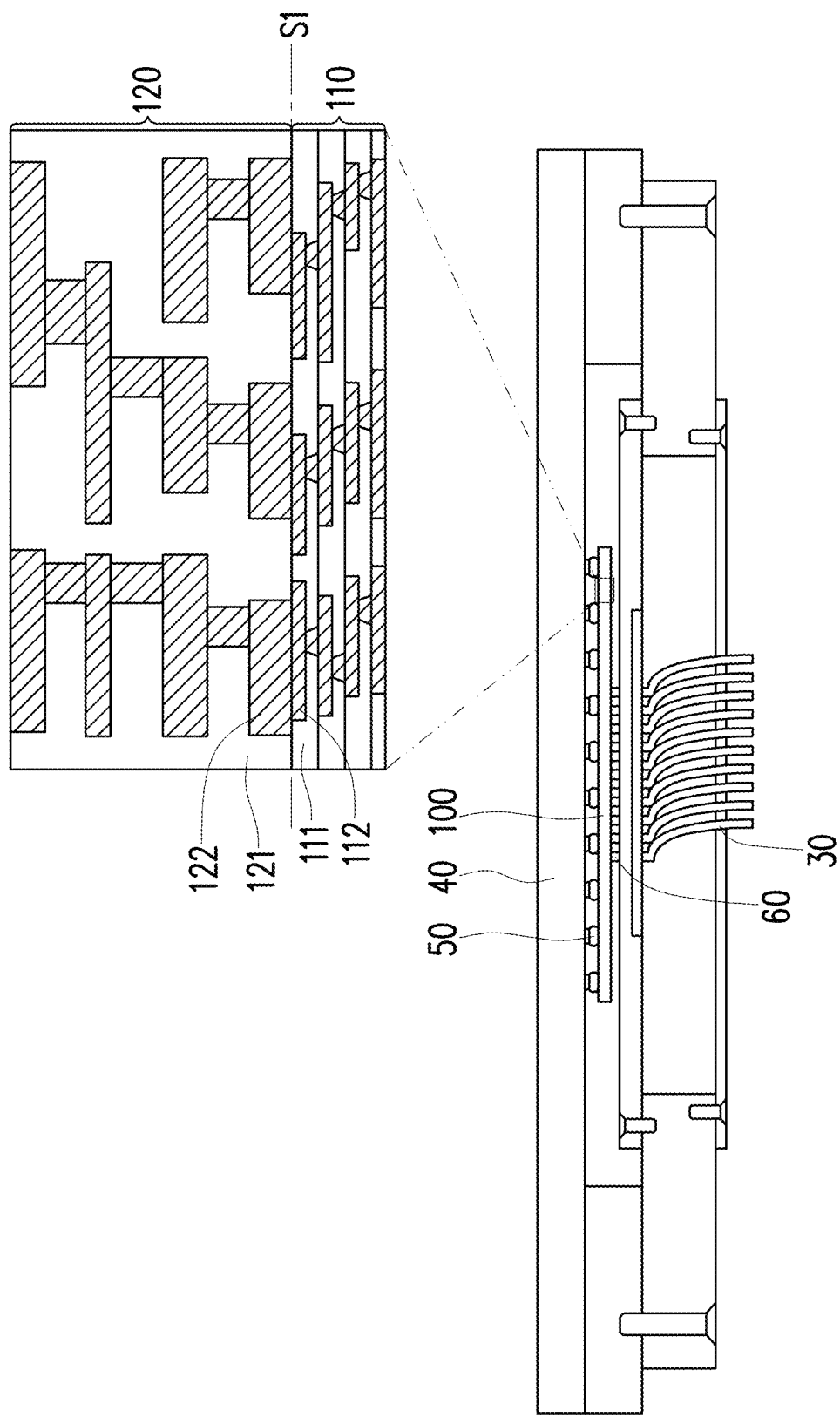
FIG. 3 is a partial cross-sectional schematic diagram of a probe card according to some embodiments of the present application.
Figure 4:
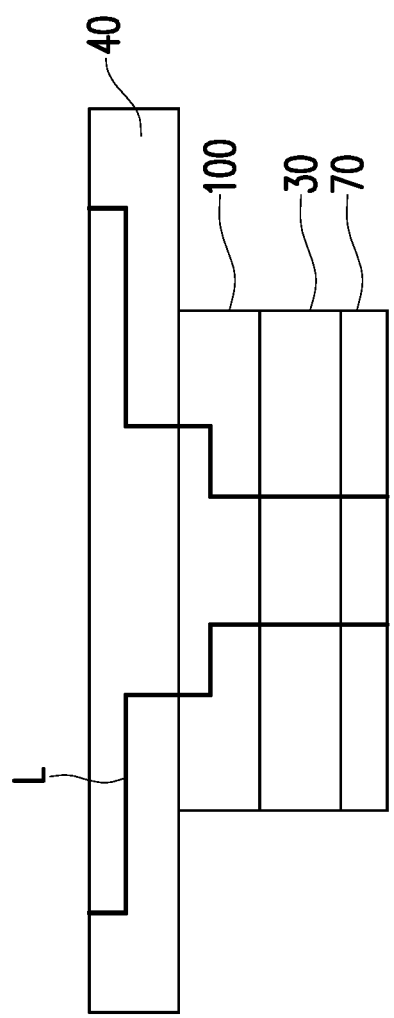
FIG. 4 is a schematic cross-sectional view of a probe card for testing according to some embodiments of the present application.

FIG. 3 is a partial cross-sectional schematic diagram of a probe card according to some embodiments of the present application. FIG. 4 is a schematic cross-sectional view of a probe card for testing according to some embodiments of the present application. Referring to FIG. 3 and FIG. 4, the probe card C of this embodiment is processed by the testing substrate 100 of FIG. 1C. Further, the probe card C includes a testing substrate 100, a plurality of probes 30 and a printed circuit board (PCB) 40, wherein the testing substrate 100 is disposed between the plurality of probes 30 and the PCB 40, and the plurality of probes 30 are adjacent to the first build-up structure 110, and the PCB 40 is adjacent to the ceramic substrate 120. Here, the probe 30 may be any suitable form of probe, and the present application is not limited thereto.

For example, the two ends of the testing substrate 100 are, for example, bonded by a ball grid array (BGA) method using solder balls 50 at the printed circuit board end, and the bonding pitch can be between 300 μm and 800 μm. The probe end is bonded by means of C4 pads 60, and the bonding pitch of the printed circuit board end can be between 300 μm and 800 μm. The bonding pitch of the probe ends can be between 50 μm and 130 μm, and the probes 30 can be in contact with the object to be tested 70 (for example, a wafer). And the tested conductive path may be shown as the line L in FIG. 4, but the present application is not limited thereto.

To sum up, the first build-up structure is bonded to the ceramic substrate by the hybrid bonding process in the testing substrate of the present application, so that a first bonding interface including a dielectric-to-dielectric bonding interface and a metal-to-metal bonding interface is formed between the first build-up structure and the ceramic substrate. In this way, the problem of easy bridging failure by solder ball/solder paste bonding can be improved, the bonding yield and interface strength of the testing substrate can be effectively improved, and the reliability of the probe card using the testing substrate can also be improved.

Although the present application has been disclosed as above with embodiments, it is not intended to limit the present application, any person with ordinary knowledge in the technical field, without departing from the spirit and scope of the present application, can make some changes. Therefore, the protection scope of the present application shall be determined by the scope of the claims.

What is claimed is:

1. A testing substrate, comprising:
a first build-up structure; and
a ceramic substrate arranged on the first build-up structure, wherein a first bonding interface between the first build-up structure and the ceramic substrate comprises a dielectric-to-dielectric bonding interface and a metal-to-metal bonding interface,
wherein the first build-up structure comprises a first dielectric layer and a first patterned conductive layer embedded in the first dielectric layer, the ceramic substrate comprises a second dielectric layer and a second patterned conductive layer embedded in the second dielectric layer, the first dielectric layer is in direct contact with the second dielectric layer, the first patterned conductive layer is in direct contact with the second patterned conductive layer, a pitch of the second patterned conductive layer is greater than a pitch of the first patterned conductive layer, and a size of the first build-up structure is the same as a size of the ceramic substrate.

2. The testing substrate according to claim 1, further comprises a second build-up structure arranged on a surface of the first build-up structure relative to the ceramic substrate, wherein a second bonding interface between the first build-up structure and the second build-up structure comprises a dielectric-to-dielectric bonding interface and a metal-to-metal bonding interface.

3. A manufacturing method of a testing substrate, comprising:

providing a first build-up structure and a ceramic substrate;

bonding the first build-up structure to the ceramic substrate by a hybrid bonding process, so that a first bonding interface including a dielectric-to-dielectric bonding interface and a metal-to-metal bonding interface is formed between the first build-up structure and the ceramic substrate, wherein a process temperature of the hybrid bonding process is between 25° C. and 350° C., and a process time is between 1 minute and 60 minutes.

4. The manufacturing method of the testing substrate according to claim 3, wherein the provided first build-up structure is arranged on a glass carrier.

5. The manufacturing method of the testing substrate according to claim 3, further comprises bonding a second build-up structure on the first build-up structure by the hybrid bonding process.

6. A probe card, comprising:
a testing substrate, wherein the testing substrate comprises:
  a first build-up structure; and
  a ceramic substrate arranged on the first build-up structure, wherein a first bonding interface between the first build-up structure and the ceramic substrate comprises a dielectric-to-dielectric bonding interface and a metal-to-metal bonding interface, wherein the first build-up structure comprises a first dielectric layer and a first patterned conductive layer embedded in the first dielectric layer, the ceramic substrate comprises a second dielectric layer and a second patterned conductive layer embedded in the second dielectric layer, the first dielectric layer is in direct contact with the second dielectric layer, the first patterned conductive layer is in direct contact with the second patterned conductive layer, a pitch of the second patterned conductive layer is greater than a pitch of the first patterned conductive layer, and a size of the first build-up structure is the same as a size of the ceramic substrate;
a plurality of probes; and
a printed circuit board, wherein the testing substrate is disposed between the plurality of probes and the printed circuit board, and the plurality of probes are adjacent to the first build-up structure, and the printed circuit board is adjacent to the ceramic substrate.

* * * * *